(12) United States Patent
Wang et al.

(10) Patent No.: US 8,606,051 B2
(45) Date of Patent: Dec. 10, 2013

(54) FRAME-WISE CALIBRATION OF COLUMN-PARALLEL ADCS FOR IMAGE SENSOR ARRAY APPLICATIONS

(75) Inventors: Yibing Michelle Wang, Temple City, CA (US); Jeffrey Joseph Rysinski, Pasadena, CA (US); Sang-Soo Lee, Cupertino, CA (US)

(73) Assignee: SK hynix Inc., Icheon-si (KR)

( * ) Notice: Subject to any disclaimer, the term of this patent is extended or adjusted under 35 U.S.C. 154(b) by 541 days.

(21) Appl. No.: 12/857,394

(22) Filed: Aug. 16, 2010

(65) Prior Publication Data

US 2012/0039548 A1 Feb. 16, 2012

(51) Int. Cl.
| | | |
|---|---|---|
| *G06K 7/00* | (2006.01) | |
| *H04N 3/14* | (2006.01) | |
| *H03M 1/12* | (2006.01) | |
| *H03M 1/00* | (2006.01) | |
| *H03M 1/34* | (2006.01) | |
| *H03M 1/56* | (2006.01) | |

(52) U.S. Cl.
USPC .......... 382/312; 348/308; 348/572; 341/126; 341/137; 341/164; 341/169

(58) Field of Classification Search
None
See application file for complete search history.

(56) References Cited

U.S. PATENT DOCUMENTS

2009/0033779 A1* 2/2009 Mo .............................. 348/308
2009/0256735 A1* 10/2009 Bogaerts .................... 341/169

* cited by examiner

*Primary Examiner* — Amir Alavi
*Assistant Examiner* — Kenny Cese
(74) *Attorney, Agent, or Firm* — Kilpatrick Townsend & Stockton LLP

(57) ABSTRACT

Circuits, methods, and apparatus are described that provide calibration of column-parallel analog-to-digital converters (ADCs) in image processing contexts only once per frame (or less frequently) to reduce column-wise noise. For example, the column ADCs are calibrated during an inter-frame time interval, like a vertical blanking interval. In some embodiments, calibration data for the column ADCs for a calibration period is stored at the digital block for use in processing row data from the column ADCs. In other embodiments, calibration data for the column ADCs for the calibration period is stored at column ADCs in a local memory for local correction of the pixel data prior to being read out to the digital block for processing. In certain embodiments, techniques, such as differential ADC architectures, are used to mitigate row-wise noise in context of the frame-wise calibration.

24 Claims, 11 Drawing Sheets

FRAME-WISE CALIBRATION OF COLUMN-PARALLEL ADCS FOR IMAGE SENSOR ARRAY APPLICATIONS

BACKGROUND

Embodiments relate to image sensors in general and, in particular, to calibration of column-parallel analog-to-digital converters (ADCs).

Proliferation of Complementary metal-oxide-semiconductor (CMOS) image sensors (CIS) in consumer markets has been accelerated by the adoption of CIS in many popular consumer electronics applications, including mobile handsets. This trend, together with the rapid growth in smartphone markets, has led manufacturers and consumers to desire apparently ever-increasing resolutions in their CIS applications. In this context, CIS designers have remained constrained by issues relating to die sizes and aspect ratios, costs, power consumption, and others.

As sensor resolution increases, operation of the sensors in desired frame rates (e.g., full HD frame rate) involves higher data conversion rates. Many typical applications of high resolution sensors employ single-slope column-parallel analog-to-digital converters (ADCs) at least to achieve these higher data conversion rates while dissipating low power. For example, in comparison to competing architectures, like global serial pipeline ADC architectures, the column-parallel ADC architecture can achieve lower read noise, and thus higher dynamic range, due to reduced bandwidth readout circuit for each column's ADC.

Typical CIS applications tend to experience both row-wise and column-wise noise from various sources. For example, some row-wise noise may result from power supply movement, and some column-wise noise, for example, including column fixed-pattern noise (CFPN), may result from variations in column circuits. The various types of noise can cause undesirable effects, including limitations on the sensitivity of the CIS, visible artifacts in the CIS output, etc. Thus, it may be desirable to provide techniques for addressing these row-wise and/or column-wise noise sources.

SUMMARY

Among other things, circuits, methods, and apparatus are described for frame-wise calibration of column-parallel analog-to-digital converters (ADCs) in image processing contexts, for example, including high-resolution CMOS image sensors (CIS). Embodiments provide techniques for calibrating the column ADCs only once per frame (or less frequently) to reduce column-wise noise (e.g., column fixed-pattern noise (CFPN)). For example, the column ADCs are calibrated during an inter-frame time interval, like a vertical blanking interval.

In some embodiments, calibration data for the column ADCs for a calibration period (e.g., one or more frames over which the calibration data is valid) is stored at the digital block for use in processing row data from the column ADCs. In other embodiments, calibration data for the column ADCs for the calibration period is stored at column ADCs in a local memory for local correction of the pixel data prior to being read out to the digital block for processing. In certain embodiments, techniques, such as differential ADC architectures, are used to mitigate row-wise noise (e.g., due to power supply movement) in context of the frame-wise calibration.

According to one set of embodiments, an image processing system is provided. The system includes an image sensor array having a plurality of pixels arranged as rows and columns; and a converter subsystem having a set of column analog-to-digital converters (ADCs), each column ADC communicatively coupled with a corresponding column of the image sensor array. The converter subsystem is configured to: convert incident light exposed to the pixels of each row into digital pixel data for the row using the set of column ADCs during a frame conversion time, each row being selected serially for processing, and the pixels of each row being converted substantially in parallel by the set of column ADCs; and calibrate the set of column ADCs during an inter-frame time interval that is outside the frame conversion time to generate calibration data for the set of column ADCs.

According to another set of embodiments, a method is provided. The method includes calibrating a set of column ADCs during an inter-frame time interval that is outside a frame conversion time to generate a calibration code corresponding to each of the set of column ADCs; converting incident light exposed to the pixels of an image sensor array into corresponding digital pixel data using the set of column ADCs during the frame conversion time, the image sensor array comprising a plurality of pixels arranged as rows and columns, and each column ADC communicatively coupled with a column of the image sensor array, such that each row is selected serially by the set of column ADCs for processing according to a row time of the frame conversion time, and the pixels of each row are converted substantially in parallel by the set of column ADCs during the corresponding row time; and correcting the digital pixel data according at least to the calibration codes for the set of column ADCs.

According to still another set of embodiments, another system is provided. The system includes means for calibrating a set of column ADCs during an inter-frame time interval that is outside a frame conversion time to generate a calibration code corresponding to each of the set of column ADCs; means for converting incident light exposed to the pixels of an image sensor array into corresponding digital pixel data using the set of column ADCs during the frame conversion time, the image sensor array including a plurality of pixels arranged as rows and columns, and each column ADC communicatively coupled with a column of the image sensor array, such that each row is selected serially by the set of column ADCs for processing according to a row time of the frame conversion time, and the pixels of each row are converted substantially in parallel by the set of column ADCs during the corresponding row time; and means for correcting the digital pixel data according at least to the calibration codes for the set of column ADCs.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

A further understanding of the nature and advantages of examples provided by the disclosure may be realized by reference to the remaining portions of the specification and the drawings wherein like reference numerals are used throughout the several drawings to refer to similar components. In some instances, a sub-label is associated with a reference numeral to denote one of multiple similar components. When reference is made to a reference numeral without specification to an existing sub-label, the reference numeral refers to all such similar components.

DETAILED DESCRIPTION

The following description provides exemplary embodiments only and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention as set forth in the appended claims.

Thus, various embodiments may omit, substitute, or add various procedures or components as appropriate. For instance, it should be appreciated that in alternative embodiments the methods may be performed in an order different than that described, and that various steps may be added, omitted, or combined. Also, features described with respect to certain embodiments may be combined in various other embodiments. Different aspects and elements of the embodiments may be combined in a similar manner.

It should also be appreciated that the following imaging systems and methods may be components of a larger system, wherein other procedures may take precedence over or otherwise modify their application. Also, a number of steps may be required before, after, or concurrently with the following embodiments.

Proliferation of Complementary metal-oxide-semiconductor (CMOS) image sensors (CIS) in consumer markets has been accelerated by the adoption of CIS in many popular consumer electronics applications, including mobile handsets. This trend, together with the rapid growth in smartphone markets, has led manufacturers and consumers to desire apparently ever-increasing resolutions in their CIS applications. In this context, CIS designers have remained constrained by issues relating to die sizes and aspect ratios, costs, power consumption, and others.

As sensor resolution increases, operation of the sensors in desired frame rates (e.g., full HD frame rate) involves higher data conversion rates. Many typical applications of high resolution sensors employ single-slope column-parallel analog-to-digital converters (ADCs) at least to achieve these higher data conversion rates while dissipating low power. For example, in comparison to competing architectures, like global serial pipeline ADC architectures, the column-parallel ADC architecture can achieve lower read noise, and thus higher dynamic range, due to reduced bandwidth readout circuit for each column's ADC.

Figure 1:
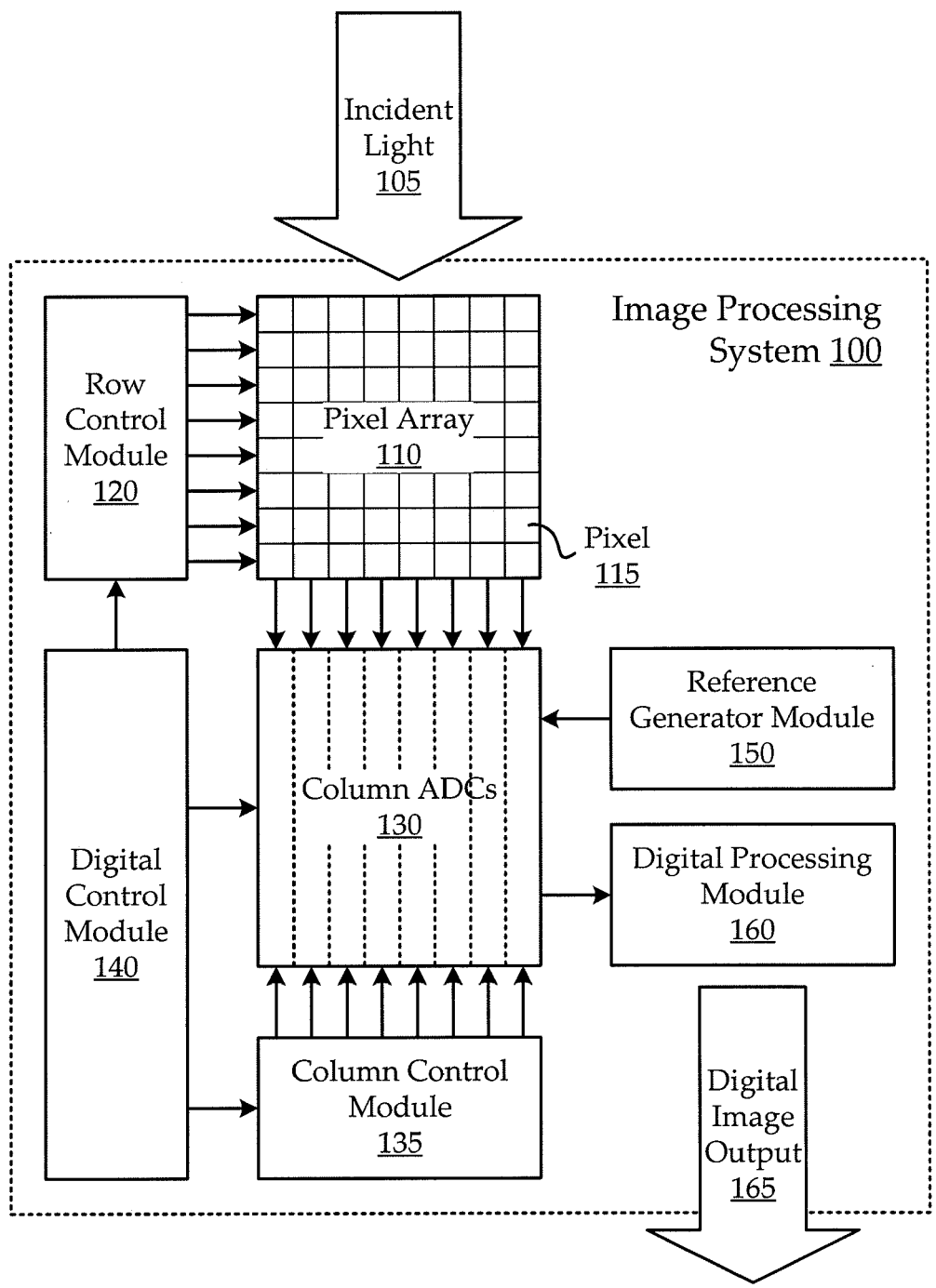
FIG. 1 shows a simplified functional block diagram of an illustrative image processing system, according to various embodiments.

Turning first to FIG. 1, a simplified functional block diagram is shown of an illustrative image processing system 100, according to various embodiments. The image processing system 100 includes a pixel array 110 configured to receive incident light 105 information and output a corresponding analog signal. The analog signal is converted into a digital representation by column ADCs 130 and passed to a digital processing module 160 for further processing in the digital domain. The digital processing module 160 outputs a digital image output 165, which is a digital representation of the incident light 105 exposed to the pixel array 110.

Generally, light interacts with each pixel 115 of the pixel array 110 as analog information. The pixels 115 are arranged in rows and columns, which effectively define the resolution of the pixel array 110 and affect the amount of incident light 105 information (e.g., light intensity data) that is converted by the image processing system 100 into digital image output 165 data. Various architectures for this type of conversion typically fall into two categories. According to one category, columnar data from each row of pixels 115 is selected and multiplexed, and the multiplexed data is converted into digital data using a serial ADC approach. According to another category, the columnar data is not multiplexed; instead, each row's data is converted column-wise into digital data by a column-parallel ADC process. FIG. 1 illustrates this second category.

Incident light 105 is detected at the pixel array 110 and converted into analog signals at each pixel 115. A row control module 120 selects each row, and the row passes its corresponding data (e.g., the analog signals from the row pixels 115) to a set of column ADCs 130. Each column ADC 130 processes one column of the row-wise data (i.e., one pixel 115) in parallel according to a column control module 135 to generate corresponding digital data for the row. The row control module 120 and the column control module 135 may be further controlled by a digital control module 140.

Different architectures are available within the column-parallel ADC approach for performing the analog-to-digital conversion. One such approach is known as "single-slope" ADC. According to single-slope ADC approaches, a reference signal, generated by a reference generator module 150, ramps with a certain slope and is compared to a pixel 115 signal level generated according to the incident light 105 intensity experienced by the corresponding pixel 115. The column ADC 130 detects a crossover point at which the ramp signal crosses the pixel 115 signal level.

As described more fully below, this crossover point may be detected using analog techniques (e.g., comparators). The crossover point may then be converted to a digital value using digital techniques. For example, embodiments use counters to determine a digital code value corresponding to the crossover point.

The reference generator module 150 is typically coupled globally with all the column ADCs 130, so that the column ADCs 130 share a common reference signal. Notably, accuracy of the digital output may be affected by accurate detection of the crossover point, which may, in turn, be affected by movement in the reference level. For example, reference levels may change from pixel 115 to pixel 115 and/or may move according to movement (e.g., noise) in the power supply. Because the reference signal is shared across the column ADCs 130, and the column ADCs 130 act on each row in parallel, movement in the reference signal tends to cause row-wise effects (referred to herein as row-wise noise).

In addition to row-wise noise, the image processing system 100 may experience column-wise noise. In particular, the image processing system 100 may typically experience several sources of column-fixed-pattern noise (CFPN), such as variations in pixel source followers, column comparators, counter and line memory timing, skew in the clock and ramp signals across the array of ADCs, etc. For example, process variations may cause circuit components from one column ADC 130 to another to be slightly different, thereby causing the column ADCs 130 to have slightly different trigger points, hysteresis, delays, etc. Because the column ADCs 130 are shared from row to row, this CFPN can propagate through the rows, affecting the digital image output 165.

Calibrating the column ADCs 130 to each other can mitigate effects of CFPN sources. Accordingly, typical column ADCs 130 may use an analog and/or digital correlated double sampling (CDS) approach. For example, analog CDS may remove pixel source follower offsets and digital CDS may remove other offsets. Applying the digital CDS approach may appreciably increase row processing times, thereby decreasing frame rates. For example, some typical digital CDS approaches involve running a ramp signal twice for calibration during the ADC conversion time for each row. Even when a partial ramp is used, this may appreciably increase the row time. Embodiments provide novel techniques for calibrating the column ADCs 130 to address CFPN, without appreciably impacting the row time.

Figure 2:
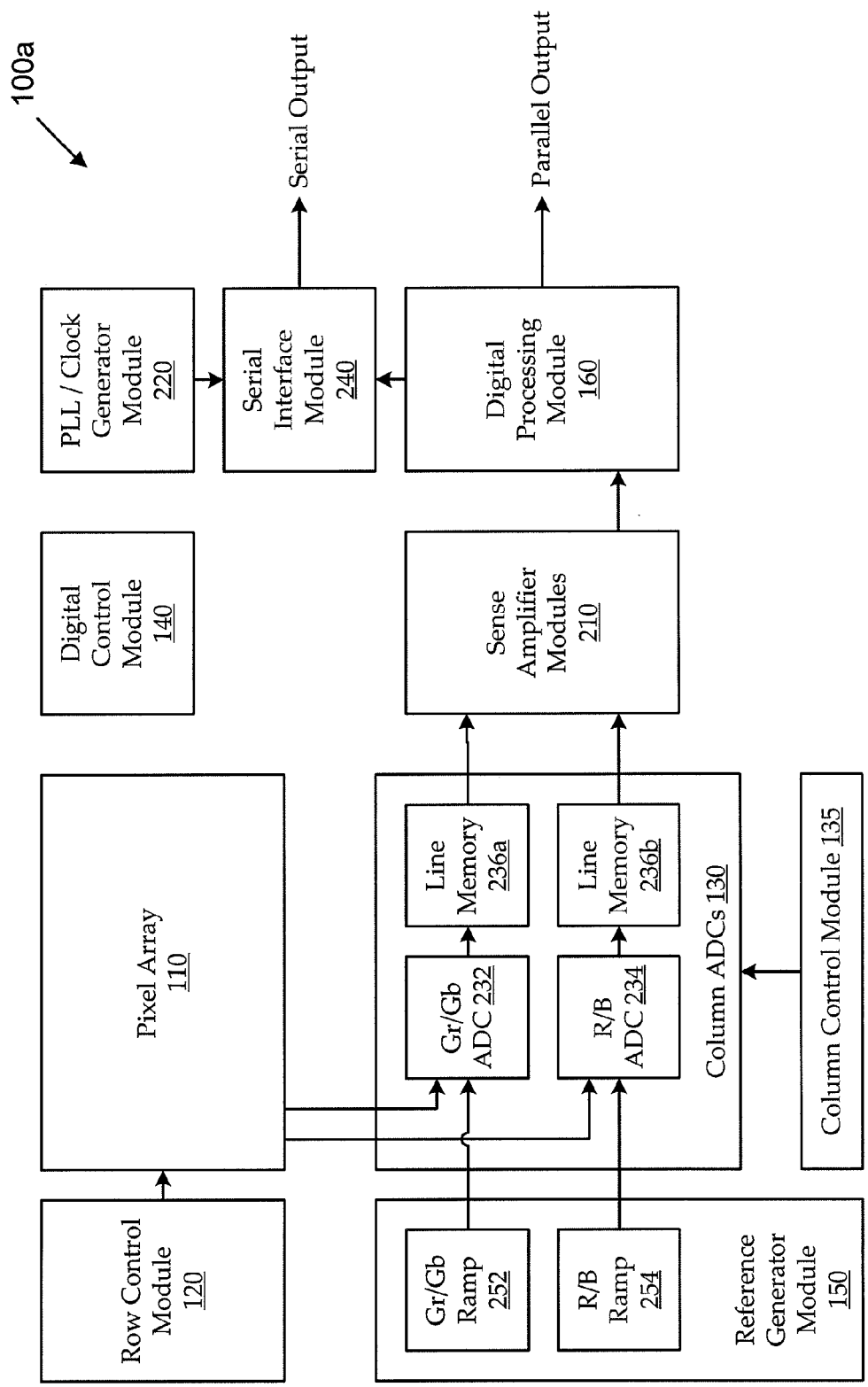
FIG. 2 shows a functional block diagram of an image processing system, which is an embodiment of the illustrative image processing system of FIG. 1.

FIG. 2 shows a functional block diagram of an image processing system 100a, which is an embodiment of the illustrative image processing system 100 of FIG. 1. Incident light is detected at the pixel array 110 and passed as analog signals in row-wise fashion, according to a row control module 120 (e.g., a row decoder), to a set of column ADCs 130. For the sake of illustration, the pixel array 110 is arranged according to a Bayer pattern, which may use 2-by-2 sub-arrays of pixels (not shown) as a color filter array including a red (R) pixel, a blue (B) pixel, and two green (Gr and Gb) pixels.

For example, active pixels in a 3264×2448 pixel array 110 are arranged in typical Bayer pattern format to produce 8-Megapixel resolution. Each column ADC 130 processes each pixel of the row-wise data in parallel with the other column ADCs 130 according to a column control module 135 (e.g., a column decoder). In the illustrated embodiment, the column ADCs 130 include Gr/Gb ADCs 232 for converting the green data, RB ADCs 234 for converting the red and blue data, and line memories 236 for facilitating the conversion and other pre-processing of the digital data at the column ADCs 130.

As described above, the conversion may involve comparison against a reference signal generated by a reference generator module 150. As illustrated, the reference signal may, in fact, be different for different color pixels. For example, pixels in the Bayer pattern may be compared against two reference signals, one for the green data generated by a Gr/Gb ramp 252, and another for the red and blue data generated by an R/B ramp 254. Use of multiple ramp signals may allow application of different amounts of gain or offset to different color data for each pixel, as the different reference signals may have different slopes, thereby causing different crossover points to be detected. In some embodiments, the reference generator module 150 is implemented as a switched-capacitor ramp generator. In other embodiments, the reference generator module 150 is implemented as a continuous-time integrator by integrating a programmable current into a capacitor with or without amplifier around the capacitor.

Data from the column ADCs 130 (e.g., from each line memory 236) is sent to one or more sense amplifier modules 210 by the column control module 135. The data may then be communicated from the sense amplifier modules 210 to the digital processing module 160 for further and/or final processing (e.g., image signal processing (ISP)). The final processed data may be output from the digital processing module 160 as a parallel digital output stream or through a serial interface module 240 (e.g., a 2-lane MIPI module) as a serial output stream.

According to some embodiments, some or all of the functional blocks of the image processing system 100a are controlled by a digital control module 140. The digital control module 140 may be implemented as a separate component or as part of the digital processing module 160. Embodiments of the digital control module 140 generate various clock signals, bias signals, reference signals, and/or other control signals that may be used by other blocks of the image processing system 100a to facilitate providing their respective functionality. The image processing system 100a is illustrated with additional functional blocks. For example, a phase-lock loop (PLL)/clock generator module 220 may be provided with an on-chip programmable PLL for synthesizing clocks for various blocks within the chip. In certain implementations, the reference generator module 150 includes charge pumps, bandgap, VDACs, IDACs, and/or other useful modules.

In column-parallel ADC applications, the rows of the pixel array 110 are processed serially, with the columns of pixels in each row being processed in parallel by the column ADCs 130. For example, each row is selected for a row time, during which the columnar pixel data for that row is processed by the column ADCs 130 in parallel. This serial/parallel processing of the entire pixel array 110 by the column ADCs 130 may be considered as a "frame," and the image processing system 100 may be configured to process frames at some frame rate (e.g., 15 frames per second). Typically, between each frame, there is a time duration, known as the vertical blanking interval.

As described above, column-fixed-pattern noise (CFPN) can be mitigated by calibrating column ADCs 130. Typical approaches may calibrate the column ADCs 130 during the frame processing time. For example, calibrating at the beginning of each row time may allow the processing also to account for row-wise noise and/or to achieve other features, as will be appreciated from the description herein. However, this technique may also increase the row time, which may, for example, appreciably limit frame rates as resolutions increase.

Embodiments described herein calibrate the column ADCs 130 during the vertical blanking interval. For example, before each frame (e.g., or before each n frames), the column ADCs 130 are calibrated and calibration values are stored for the respective column ADCs 130. The same calibration values are used by the column ADCs 130 for processing during each row time of the proceeding frame (e.g., or n frames). This may address CFPN without appreciably impacting the row time and/or the frame rate.

Figure 3A:
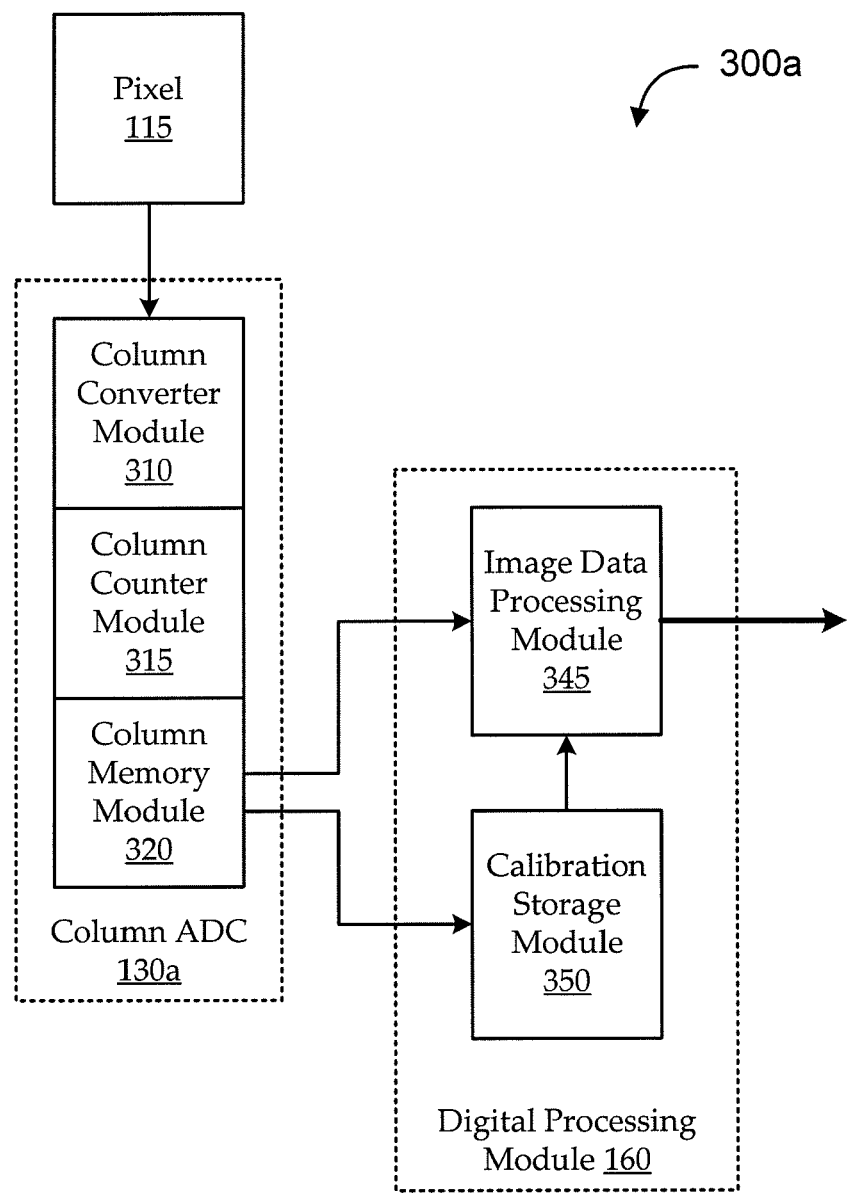
FIGS. 3A and 3B show simplified block diagrams of a portion of an image processing system, according to various embodiments.
Figure 3B:
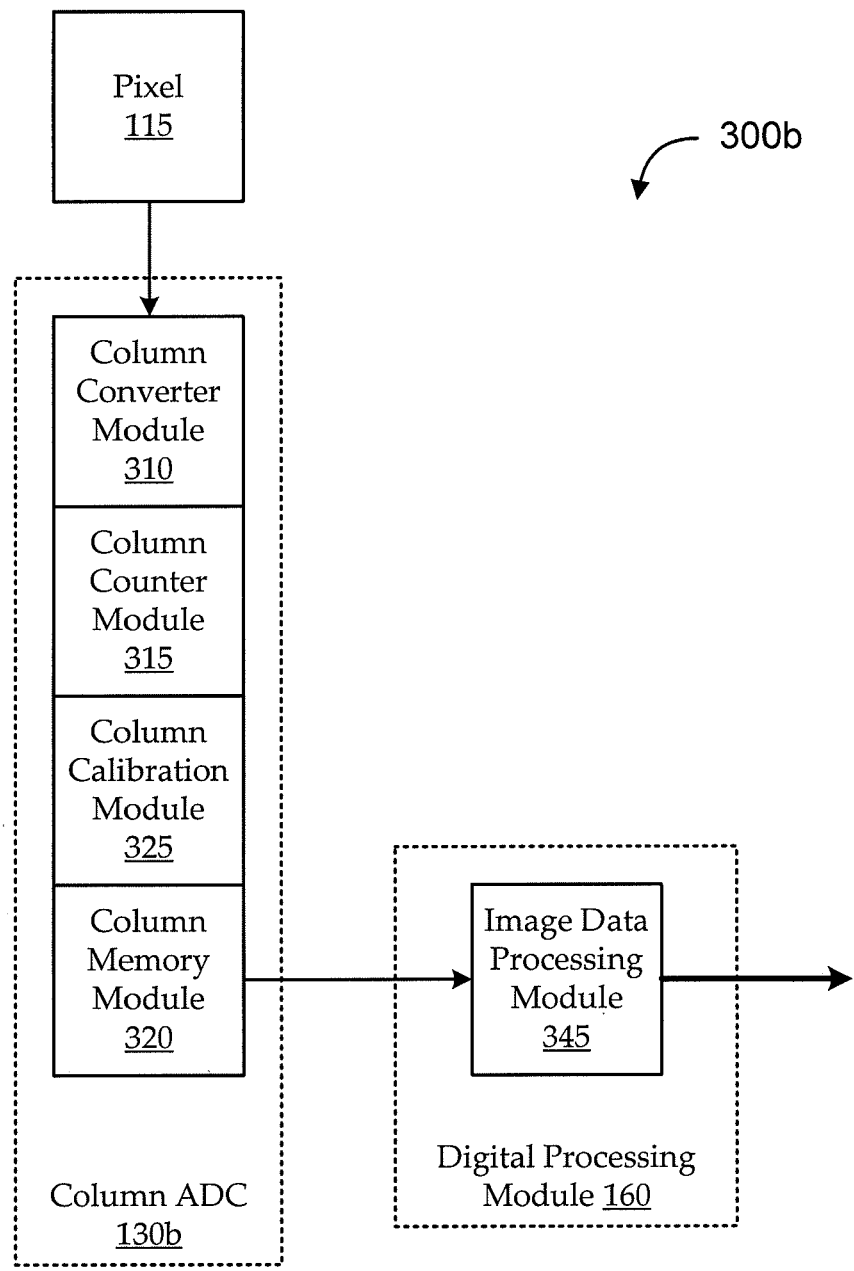

Implementing frame-wise calibration techniques may involve novel structures and/or interactions for and/or between the column ADCs 130 and the digital processing module 160. FIGS. 3A and 3B show simplified block diagrams of a portion of an image processing system 300, each having an illustrative column ADC 130 architecture, according to various embodiments. Embodiments of the image processing systems 300 may illustrate portions of the image processing systems 100 of FIG. 1 or 2.

Turning first to FIG. 3A, a column ADC 130a receives an analog signal from a pixel 115 (e.g., of image sensor array 110 of FIG. 1 or 2) corresponding to incident light experienced by the pixel 115, converts the analog signal to digital image data, and communicates the digital image data to a digital processing module 160. The column ADC 130a includes a column converter module 310, a column counter module 315, and a column memory module 320. As with a typical column ADC 130, the column memory module 320 is in communication with the digital processing module 160 (e.g., the digital block), where image data is processed by an image data processing module 345. As illustrated, the digital processing module 160 further includes a calibration storage module 350 (e.g., as a memory block of the image data processing module 345).

Calibrating the column ADC 130a may involve resetting a counter value of the column counter module 315. In some embodiments, the column counter module 315 is a ripple up counter. A reference pixel 115 value (e.g., a pixel reset value, as described below) is sampled at the column converter module 310. A ramp signal (e.g., generated by the reference generator module 150) begins to change according to a slope, and the column counter module 315 starts to count. The column counter module 315 runs for some fixed time to measure the column ADC 130a offset.

In some embodiments, the ramp time is shorter than the ramp time used during frame row processing. For example, the offset values are typically relatively small, such that only a partial ramp time may be needed to measure the offset. In other embodiments, the full ramp time is run to accommodate any offset value. For example, since the row time is fixed and the full ADC memory (e.g., at the column memory module 320) may be available, it may be desirable to run the full ramp time.

When the column counter module 315 stops counting, the ending counter value is loaded as a calibration code to the column memory module 320. The calibration code can then be read out to the digital processing module 160, for example, during the following row time. In some embodiments, the calibration codes for all the column ADCs 130 (e.g., implemented substantially as clones of the illustrated column ADC 130a) working in parallel are stored in the calibration storage module 350 for the entire frame (e.g., or for n frames, where the calibration occurs only every n frames).

During frame processing, converted digital image data is read out to the digital processing module 160 for processing by the image data processing module 345. The calibration codes for the frame may be communicated from the calibration storage module 350 to the image data processing module 345. The image data processing module 345 subtracts the calibration codes for each column from the row-wise data being received at the image data processing module 345 from the column ADCs 130.

According to the embodiment illustrated in FIG. 3B, as in FIG. 3A, a column ADC 130b receives an analog signal from a pixel 115 (corresponding to incident light experienced by the pixel 115), converts the analog signal to digital image data, and communicates the digital image data to a digital processing module 160. The column ADC 130b includes a column converter module 310, a column counter module 315, and a column memory module 320. As with a typical column ADC 130, the column memory module 320 is in communication with the digital processing module 160 (e.g., the digital block), where image data is processed by an image data processing module 345.

Unlike the column ADC 130a in FIG. 3A, the column ADC 130b of FIG. 3B is configured for storage of the calibration code at the column. Accordingly, the digital processing module 160 does not include a calibration storage module 350; rather, the column ADC 130b includes a column calibration module 325 for storage of the frame calibration code for that column. Operation of the column ADC 130b may be similar to that of the column ADC 130a of FIG. 3A.

Calibrating the column ADC 130b may involve resetting a counter value of the column counter module 315. A reference pixel 115 value is sampled at the column converter module 310. A ramp signal begins to change according to a slope, and the column counter module 315 starts to count. The column counter module 315 runs for some fixed time to measure the column ADC 130 offset. When the column counter module 315 stops counting, the resulting code is loaded as a calibration code to the column calibration module 325. In some embodiments, the calibration codes for all the column ADCs 130 working in parallel are stored in their respective column calibration modules 325 for the entire frame (e.g., or for n frames, where the calibration occurs only every n frames).

During frame processing, pixel 115 signal (e.g., photo) value is sampled at the column converter module 310 (e.g., according to analog CDS techniques). The calibration code is loaded to the column counter module 315 from the column calibration module 325, such that, when the ramp signal begins to change according to its slope, the column counter module 315 starts to count in a way that accounts for the calibration code.

For example, the "two's complement" of the calibration code is loaded to the counter. In one embodiment, the ramp clock and counter clock (for the column counter module 315) are synchronized, and the column counter module 315 is held in reset for the first clock cycle. In this way, if the calibration code should be C, the ending counter value will be C−1. The ending counter value is loaded into the column memory module 320, which may be a latch. According to the "two's complement" technique, a negative value is calculated by inverting all the bits of n−1. The latch stores both the true and complementary values, so that the complementary value can be loaded back into the column counter module 315. When the complementary value of C−1 (i.e., the ending counter value) is loaded into the column counter module 315, the column counter module 315 can effectively start counting from the negative of the calibration code (i.e., negative−C).

The column counter module 315 runs for some time to find a value corresponding to the pixel signal value. For example, as described below, the column counter module 315 stops counting substantially when the ramp signal level crosses the pixel signal level, causing an output of a gain stage of the column ADC 130b to change polarity. When the column counter module 315 stops counting, the ending counter value effectively corresponds to the pixel signal value corrected by column ADC 130b offset (calibration) value. The converted (and corrected) digital image data is read out to the digital processing module 160 for processing by the image data processing module 345.

Notably, the column memory module 320 may be sized to store at least the full range of the column counter module 315. For example, a 10-bit column memory module 320 may support counter values from "0" ("0000000000") to "1023" ("1111111111"). The calibration code may typically be a relatively small value in comparison to the full range of the counter. For example, as noted above, the calibration ramp time may be appreciably shorter than the ramp time used during frame row processing. As such, in some embodiments, the column calibration module 325 is sized to store only small (e.g., typical) calibration codes (e.g., 3-bit codes). In other embodiments, the column calibration module 325 is sized in other ways, for example, to accommodate the full column counter module 315 range (e.g., 10-bit codes).

It is worth noting that the different architectures of FIGS. 3A and 3B provide different features and/or trade-offs. For example, the embodiment of FIG. 3A can be implemented with a standard column ADC 130 architecture, but involves adding functionality to the digital block (e.g., adding the calibration storage module 350 in communication with the image data processing module 345). While this may simplify the design and layout of the column ADCs 130, there may be a loss of dynamic range. For example, if the column counter module 315 is configured to count up to "1023" (i.e., a 10-bit counter), and the calibration code (ADC offset) is determined to be "30", the dynamic range of that column ADC 130 for that frame may only be from "0" to "993."

According to the embodiment of FIG. 3B, standard digital block functional can be used, but an additional memory is included in each column ADC 130 (i.e., the column calibration module 325). While this may add complexity to the design and layout of the column ADCs 130 (e.g., it may impact the aspect ratio of each column ADC 130), the implementation may allow the full dynamic range of the column ADCs 130 to be used. For example, suppose again that the column counter module 315 is configured to count up to "1023" (i.e., a 10-bit counter), and the calibration code (ADC offset) is determined to be "30." According to the FIG. 3B embodiment, the column counter module 315 will begin to count from "−30," instead of from "0." Thus, instead of cutting off the top of the dynamic range of the column ADC 130, the range is pre-offset according to the ADC offset.

The column ADC 130 functionality described above with reference to FIGS. 3A and 3B may be implemented using various circuit architectures. For example, some embodiments use traditional single-ended, single-slope, column-parallel ADCs. When calibration occurs only once per frame (or less frequently), row-wise noise (e.g., power supply movement) may be experienced between row times, particularly with single-ended architectures. Some embodiments use differentially driven, single-slope, column-parallel ADCs to mitigate row-wise noise in the context of frame-wise calibration techniques.

Figure 4:
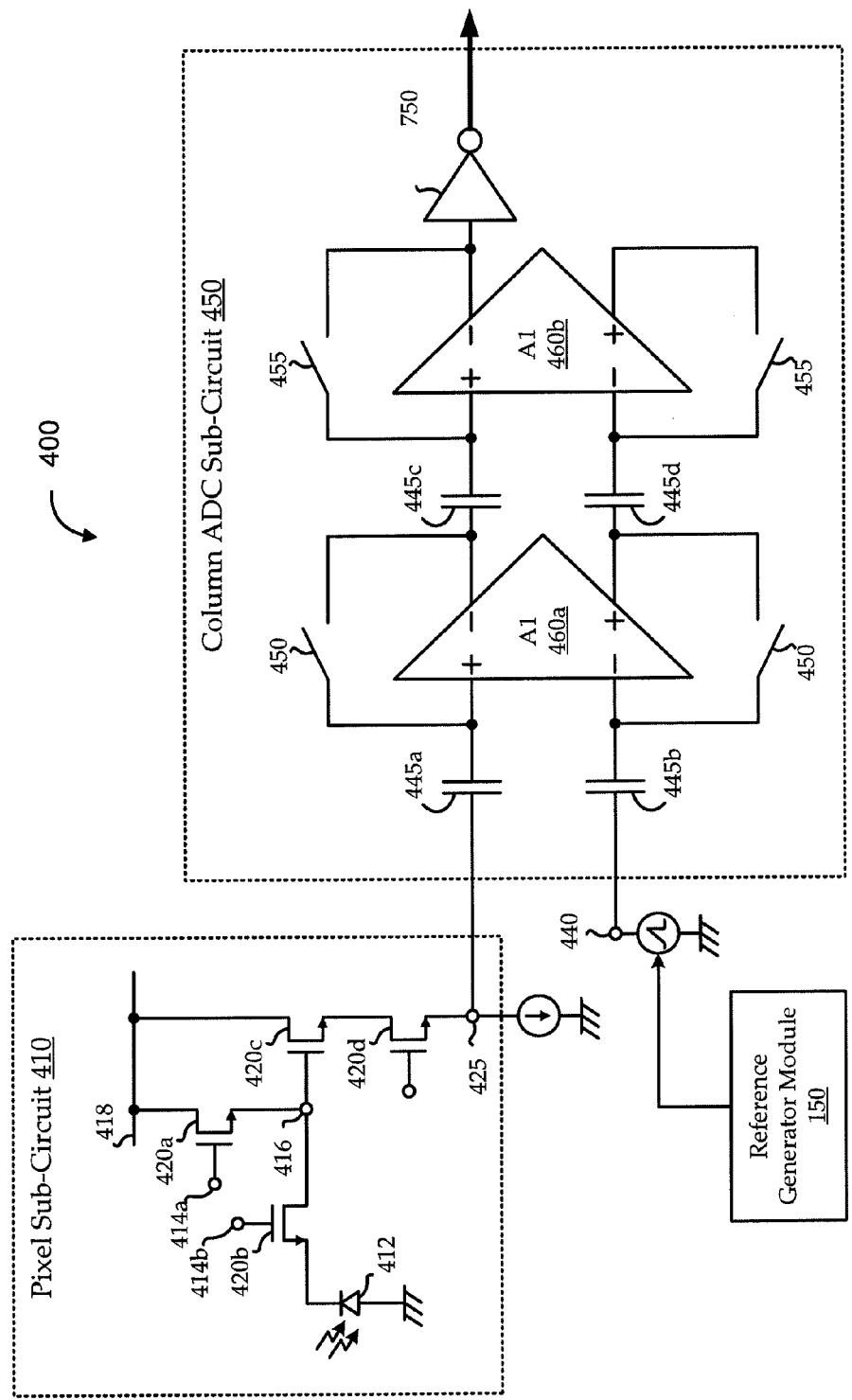
FIG. 4 shows a simplified circuit diagram for implementing a differentially driven column ADC architecture, according to various embodiments.

FIG. 4 shows a circuit diagram 400 of an illustrative pixel sub-circuit 410 in communication with a differential column ADC sub-circuit 450, according to various embodiments. The column ADC sub-circuit 450 is illustrated in simplified form, and may represent an illustrative implementation of the column converter module 310 shown in either FIG. 3A or 3B. The pixel sub-circuit 410 may be implemented as part of an illustrative pixel, such as the pixel 115 of FIG. 3A or 3B.

As described more fully below, embodiments of the column ADC sub-circuit 450 include certain features. One such feature is that the column ADC sub-circuit 450 is configured to implement analog correlated double sampling (CDS), which may remove pixel source follower offsets. Another such feature is that a two-stage comparator 460 architecture (e.g., or a single-stage or three-stage architecture, according to other embodiments) is employed with an auto-zero feature to remove comparator offsets in the analog domain. The auto-zero feature may, for example, improve accuracy by removing offset in the analog domain instead of in the digital domain where quantization errors can occur.

As illustrated, the pixel sub-circuit 410 is shown as a "4T" architecture having a light sensor 412 (e.g., a photodiode) coupled with a four-transistor network. A reset signal (RX) 414a turns ON a reset transistor 420a (i.e., so that it is conducting), pulling intermediate node 416 to a reset pre-level according to a pixel source voltage ($V_{DD}$) 418. For example, the reset pre-level is defined by the pixel source voltage ($V_{DD}$) 418 minus any voltage drop across the reset transistor 420a. Using a source follower configuration (e.g., transistors 420c and 420d), the reset pre-level is passed from the intermediate node 416 (e.g., the floating diffusion (FD) node) to a pixel output node 425 as a reset level (e.g., which may typically differ from the reset pre-level due to effects of transistors 420c and 420d and/or other components of the pixel sub-circuit 410).

When the reset signal 414a turns ON reset transistor 420a, the reset level at pixel output node 425 is effectively sampled on capacitor 445a. A ramp reset level (e.g., a reference DC voltage) may be sampled on capacitor 445b. As illustrated, capacitors 445a and 445b are coupled with differential inputs of a first stage comparator 460a, configured as a first gain stage of the column ADC sub-circuit 450. Accordingly, the column ADC sub-circuit 450 is differentially driven by pixel output signals at one differential input (e.g., the positive differential input node of the first stage comparator 460a), and by ramp output signals at another differential input (e.g., the negative differential input node of the first stage comparator 460a).

In the reset operating state, switches 450, each disposed in a feedback path of a first stage comparator 460a, are ON (e.g., for offset storage). This may be referred to as a comparator reset mode, or an auto-zero mode. As illustrated, the outputs of first stage comparator 460a are capacitively coupled (i.e., via capacitors 445c and 445d) with inputs of a second stage comparator 460b. Second stage comparator 460b also has switched feedback paths including switches 455. Notably, by sequentially turning OFF (e.g., opening) switches 450 and 455, an offset introduced by the first stage comparator 460a can be effectively cancelled and an input-referred offset of the overall structure is greatly reduced by comparator 460 gain stages (460a and 460b).

After the reset level has been set, an actual pixel signal level can be recorded. For example, reference transistor 420a is turned OFF (e.g., by signal RX 414a), and signal transistor 420b is turned ON (e.g., by signal (TX) 414b) to pass the signal generated by the light sensor 412 to the intermediate node 416. This signal can be communicated, through the source follower configuration of transistors 420c and 420d, from the intermediate node 416 to the pixel output node 425 and, thereby to the column ADC sub-circuit 450, as a pixel signal level.

The pixel signal level may typically be some voltage level below the previously recorded reference level, where a larger signal at the light sensor 412 typically translates to a larger difference between the pixel reference level and the pixel signal level (i.e., a difference signal). This operation, known as correlated double sampling (CDS), may remove pixel reset noise and produce a difference signal between the pixel reset level and a subsequent pixel signal level at the input of the first stage comparator 460a. The pixel signal level is applied to the first stage comparator 460a of the column ADC sub-circuit 450 via capacitor 445a, and an downward ramp signal 440 (e.g., generated by the reference generator module 150) is applied to the first stage comparator 460a of the column ADC sub-circuit 450 via capacitor 445b. When the difference signal is fully compensated by the reference ramp signal 440, the comparator 460a output changes polarity. By recording the point at which the change in polarity occurs, a digital code corresponding to the difference signal is detected.

As described above, this digital code can be recorded using a counter, and the counter can be calibrated to account for column ADC offset in a frame-wise fashion (e.g., before each frame or before each n frames). For example, any timing variation due to comparators, counters, or memories can be removed in the digital domain by using calibration techniques. Notably, the sources of these timing variations are not typically time dependent. For example, device mismatches, parasitics, etc. remain substantially constant over time (e.g., at least over the timeframe of a single frame or a small, finite number of frames). As such, embodiments perform frame-wise calibration (e.g., during the vertical blanking interval), rather than executing a calibration sequence for every conversion.

Figure 5A:
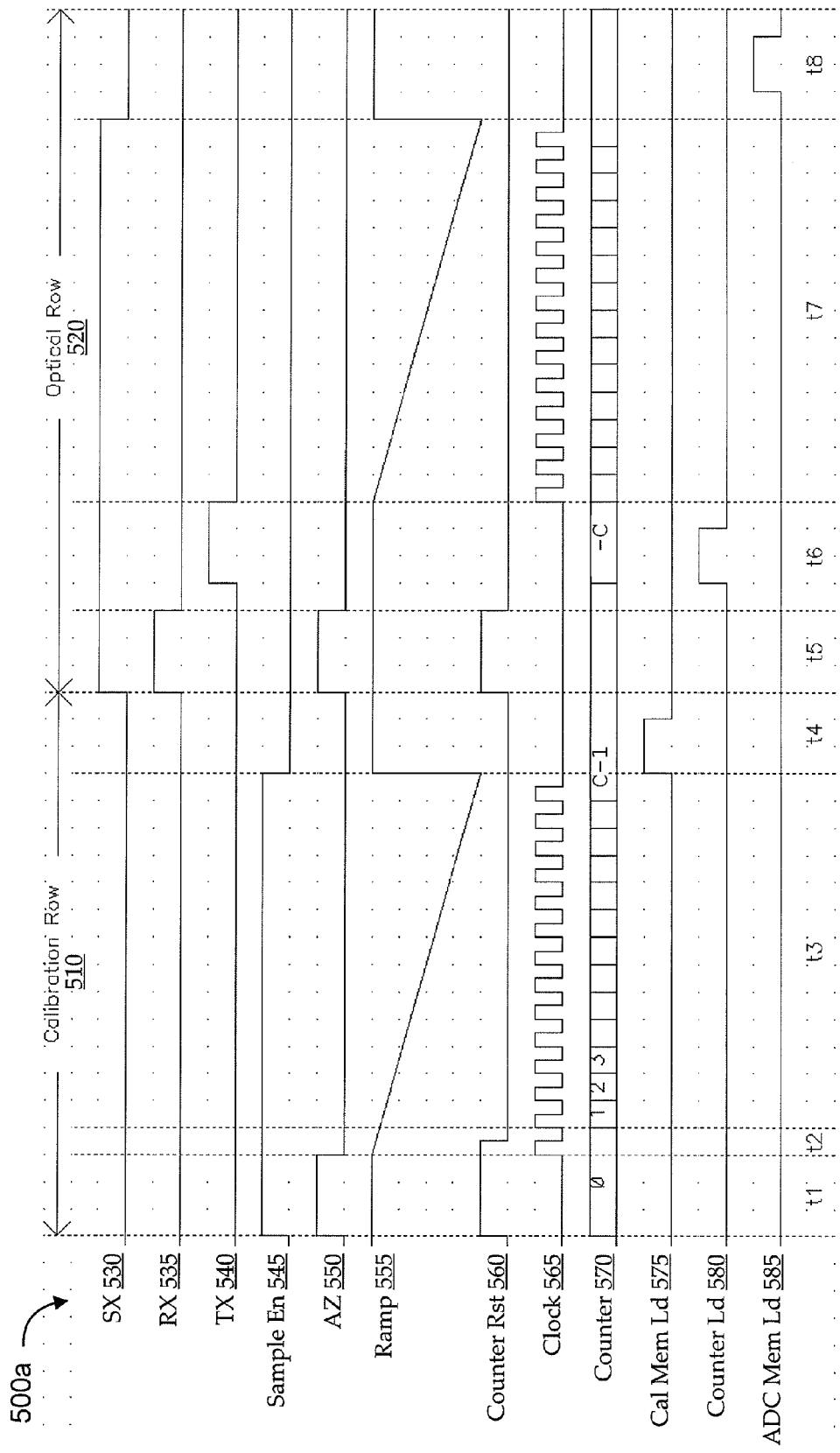
FIGS. 5A and 5B show a timing diagram for calculating and using a column ADC, according to various embodiments.
Figure 5B:
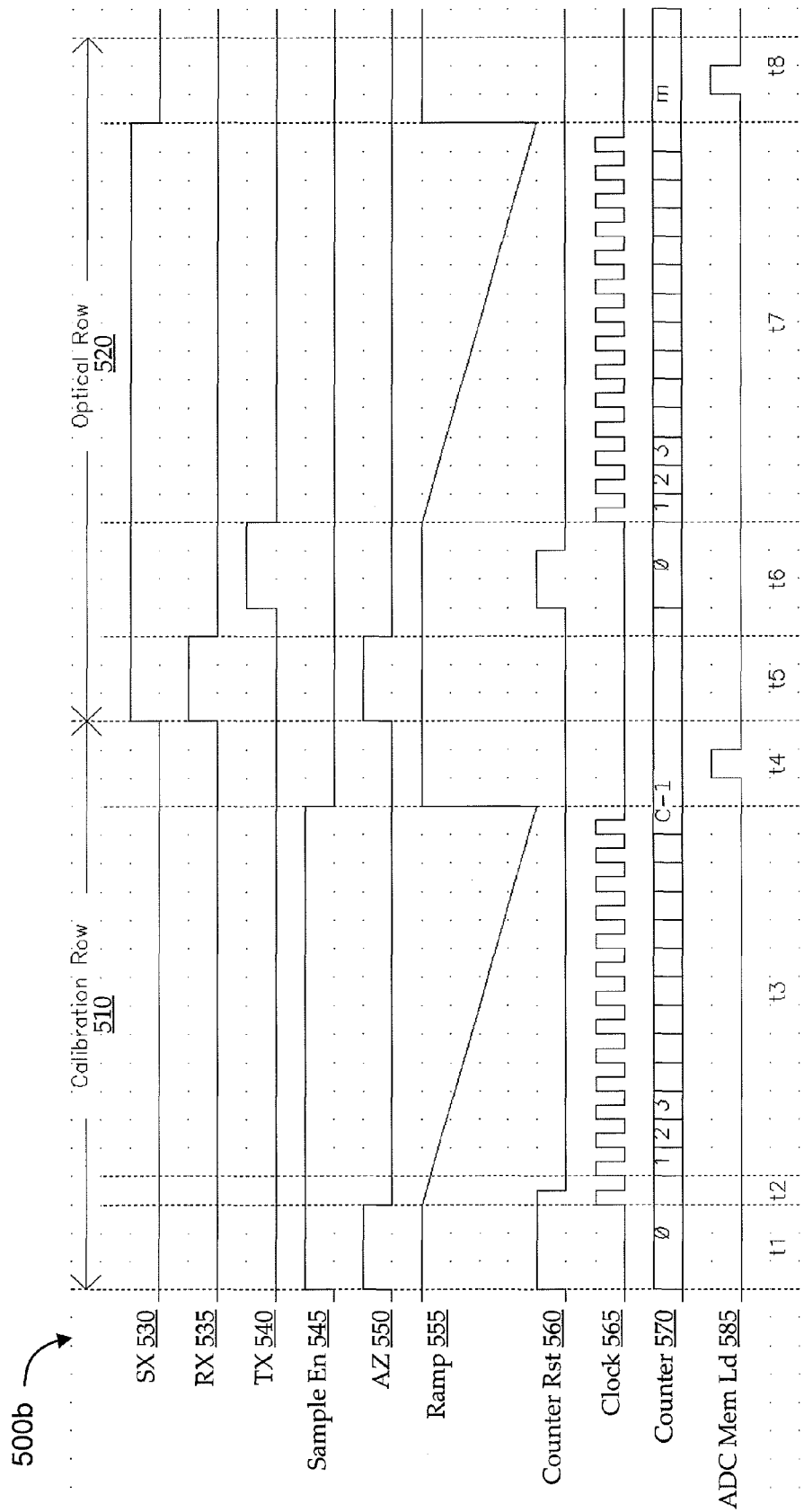

The frame-wise calibration can be implemented in a number of ways, including those described with reference to FIGS. 3A and 3B. For the sake of added clarity, FIGS. 5A and 5B show timing diagrams 500 for using a frame-wise calibration row in calibrating the column ADCs according to the techniques of FIGS. 3B and 3A, respectively. The waveforms shown in the timing diagrams 500 are intended only as illustrative cases for added clarity, and should not be construed as limiting the scope of the disclosure or the claims in any way.

Turning to FIG. 5A, an illustrative timing diagram 500a is shown for calibrating and using a column ADC according to techniques like those described in FIG. 3B. As described above, the column ADC 130b of FIG. 3B is configured to store calibration values locally at the column ADC 130b.

The timing diagram 500a is divided into a calibration row time 510 and an optical row time 520, each of which is further divided into timing segments (e.g., "t1," "t2," etc.) to aid in the description. For example, the calibration row time 510 is a period of time during which the calibration sequence is executed, and may occur immediately preceding a first optical row time 520 of a frame, as illustrated, or at any other useful time (e.g., there may be a delay prior to the optical row time 520, the calibration row time 510 may occur preceding the first optical row time 520 of only every n frames, etc.). The optical row time 520 illustrates processing of one column during one row time of a frame processing sequence In one embodiment, the calibration row time 510 is added at the beginning of the frame processing sequence. From the perspective of the signal processing system, it may appear effectively as though one more row were added to the image sensor array (though the calibration code storage may occur differently than would the normal image output data storage). For example, the image sensor array may be configured as active pixels in a 3264×2448 array, arranged in typical Bayer pattern format to produce 8-Megapixel resolution. It will be appreciated that adding one more row time to an array of this size may have little or no appreciable impact on the frame rate.

The calibration row time 510 may be used to measure the comparator/counter/memory propagation delay. During a first time segment (t1) the column counter module 315 is reset (e.g., to "0"), as shown in waveforms 560 and 570; the column converter module 310 is reset (e.g., the comparators 460 are put in auto-zero mode by switches 450 and 455), as shown in waveform 550; and the column converter module 310 samples inputs to the first stage comparator 460a. As illustrated, the pixel 115 is configured so that a row select signal (SX), RX 414a, and TX 414b are all LOW, as shown in waveforms 530, 535, and 540, respectively. The ramp signal is held at some ramp reset level, as shown in waveform 555. As such, a DC voltage level from the pixel 115 (e.g., enabled by a Sample Enable signal, as shown in waveform 545) and the ramp reset level are sampled (e.g., twice according to the analog CDS) at the inputs to the first stage comparator 460a.

A second time segment (t2) may be used to offset the counter value by one clock cycle to support two's complement techniques, as described above. For example, the ramp clock and counter clock are both synchronized, as shown in waveform 565, and the counter is held in reset mode into the first clock cycle, as shown in waveform 560. Holding the column counter module 315 in reset for the first clock cycle causes the ending counter value to be C−1, where the calibration code would be C.

During a third time segment (t3), the clock runs (waveform 565), the ramp signal changes according to a slope (waveform 555), and the column counter module 315 counts (waveform 570) for a fixed time to measure the ADC offset. When the ADC offset value is reached, the ending counter value is C−1, as described above.

At a fourth time segment (t4), the ending counter value is loaded into the column calibration module 325, as shown in waveform 575. The column calibration module 325, which may be a latch, stores the true and/or complimentary values, for example, to facilitate loading the complementary value back into the column counter module 315 for each row. Notably, the calibration ramp time is shown to be the same as the ramp time during the optical row time 520, though, as noted above, the calibration ramp time can be shorter than a typical ramp cycle in some embodiments.

The optical row time 520 begins at a fifth time segment (t5). For example, the illustrated optical row time 520 is the start of an image readout sequence, and represents the first optical row. The row is selected (SX), the pixel is reset (RX 414a), the comparators 460 of the column converter module 310 are reset (by switches 450 and 455), the column counter module 315 is reset, and the ramp is reset. This is illustrated by waveforms 530, 535, 550, 560, and 555, respectively. Accordingly, a pixel reset level and the ramp reset level are sampled at the inputs to the first stage comparator 460a (e.g., differentially via respective capacitors 445a and 445b).

At a sixth time segment (t6), the comparators are taken out of auto-zero mode, and a pixel signal (photo) level applied to the column converter module 310 (e.g., in place of the pixel reset level), as shown in waveforms 550 and 540, respectively. Also during this time, the column counter module 315 is loaded with the negative of the ADC offset value (e.g., the complement of 'C−1,' which equals '−C') from the column calibration module 325, as shown in waveforms 570 and 580.

At a seventh time segment (t7), the optical signal is converted by the column ADC 130. The ramp/counter clock starts and continues for a fixed period of time (e.g., long enough to complete a full conversion), as shown in waveform 565. The column counter module 315 for the column starts at '−C' so that the calibration value is subtracted from the true signal value, as shown in waveform 570. Notably, other digital subtraction techniques may be used according to other embodiments. During this time, the optical signal and a changing ramp signal (waveform 555) are sampled at the inputs of the column converter module 310 (e.g., differentially at inputs of the first stage comparator 460a). The true signal value may be detected in a number of ways, for example, by detecting when outputs of the comparators 460 change polarity via an output inverter, a one-shot device, or another similar device.

At an eighth time segment (t8), the ramp/counter clock stops, and the column counter module 315 stops counting, as shown in waveforms 565 and 570, respectively. The ramp is reset to its default level and the row is deselected, as shown in waveforms 555 and 530, respectively. The final converted signal value is loaded into the output memory (the column memory module 320), as shown in waveform 585, and is ready for readout to the digital block (e.g., digital processing module 160). Remaining rows can then be read by increasing a row address associated with the next row's SX signals, and iterating to the fifth time segment (t5).

Turning now to FIG. 5B, an illustrative timing diagram 500b is shown for calibrating and using a column ADC according to techniques like those described in FIG. 3A. As described above, the technique of FIG. 3A is configured to store the calibration values at the digital processing module 160 in a calibration storage module 350.

As described with reference to FIG. 5B, the timing diagram 500b is divided into a calibration row time 510 and an optical row time 520, each of which is further divided into timing segments (e.g., "t1," "t2," etc.) to aid in the description. The first three time segments of the calibration row time 510 (i.e., t1, t2, and t3) may occur as described with reference to FIG. 5B. During the first time segment (t1), components participating in the calibration sequence are configured into pre-defined initial conditions. During the second time segment (t2), the column counter module 315 is held for one clock cycle to offset the ending counter value by one (to support two's complement techniques). During the third time segment (t3), the ADC offset value is measured. At a fourth time segment (t4), the ending counter value is loaded to the column memory module 320 for readout to the calibration storage module 350 in the digital processing module 160, as illustrated by waveform 585.

The optical row time 520 begins at a fifth time segment (t5). As in FIG. 5B, the row is selected (SX), the pixel is reset (RX 414a), the comparators 460 of the column converter module 310 are reset (by switches 450 and 455), the column counter module 315 is reset, and the ramp is reset, as shown in waveforms 530, 535, 550, 560, and 555, respectively. Accordingly, a pixel reset level and the ramp reset level are sampled at the inputs to the first stage comparator 460a (e.g., differentially via respective capacitors 445a and 445b).

At a sixth time segment (t6), the comparators are taken out of auto-zero mode, and a pixel signal (photo) level applied to the column converter module 310 (e.g., in place of the pixel reset level), as shown in waveforms 550 and 540, respectively. Unlike in FIG. 5A where the column counter module 315 is loaded with the negative of the ADC offset value, the timing diagram 500b of FIG. 5B shows the column counter module 315 being reset (waveform 560) and starting at "0" (waveform 570).

At a seventh time segment (t7), the optical signal is converted by the column ADC 130, for example, as described above with reference to time segment t7 of FIG. 5B. At an eighth time segment (t8), the ramp/counter clock stops, and the column counter module 315 stops counting, as shown in waveforms 565 and 570, respectively. The ramp is reset to its default level and the row is deselected, as shown in waveforms 555 and 530, respectively. The final converted signal value is loaded into the output memory (the column memory module 320), as shown in waveform 585, and is ready for readout. Remaining rows can then be read by increasing a row address associated with the next row's SX signals, and iterating to the fifth time segment (t5). As described above, the calibration value may be applied at the digital processing module 160 to the data read out from the rows (e.g., after each row is read out, or at any useful time).

It is worth noting that alternate architectures can be used to implement the column ADC 130 functionality described above without departing from the scope of the disclosure or the claims. In some embodiments, as described above, a single-ended, rather than differentially driven, architecture can be used. In other embodiments, other differential architectures are used. For example, according to the circuit 400 of FIG. 4, each signal source (e.g., the pixel or the ramp reference generator) is tied to one of the differential inputs of the comparator 460. For example, the positive input receives both either a pixel reset level or a pixel signal level, while the negative input receives either a ramp reset level or a ramp signal level. According to another differential architecture, each differential input of the comparator 460 receives one pixel output signal 410 and one ramp output signal 705. For example, the positive input receives both the pixel and ramp reset levels, while the negative input receives both the pixel and ramp signal levels. Some embodiments of column ADC architectures are described in U.S. patent application Ser. No. 12/857,386, titled "DIFFERENTIAL COLUMN ADC ARCHITECTURES FOR CMOS IMAGE SENSOR APPLICATIONS," filed Aug. 16, 2010, which is incorporated herein by reference in its entirety.

Figure 6:
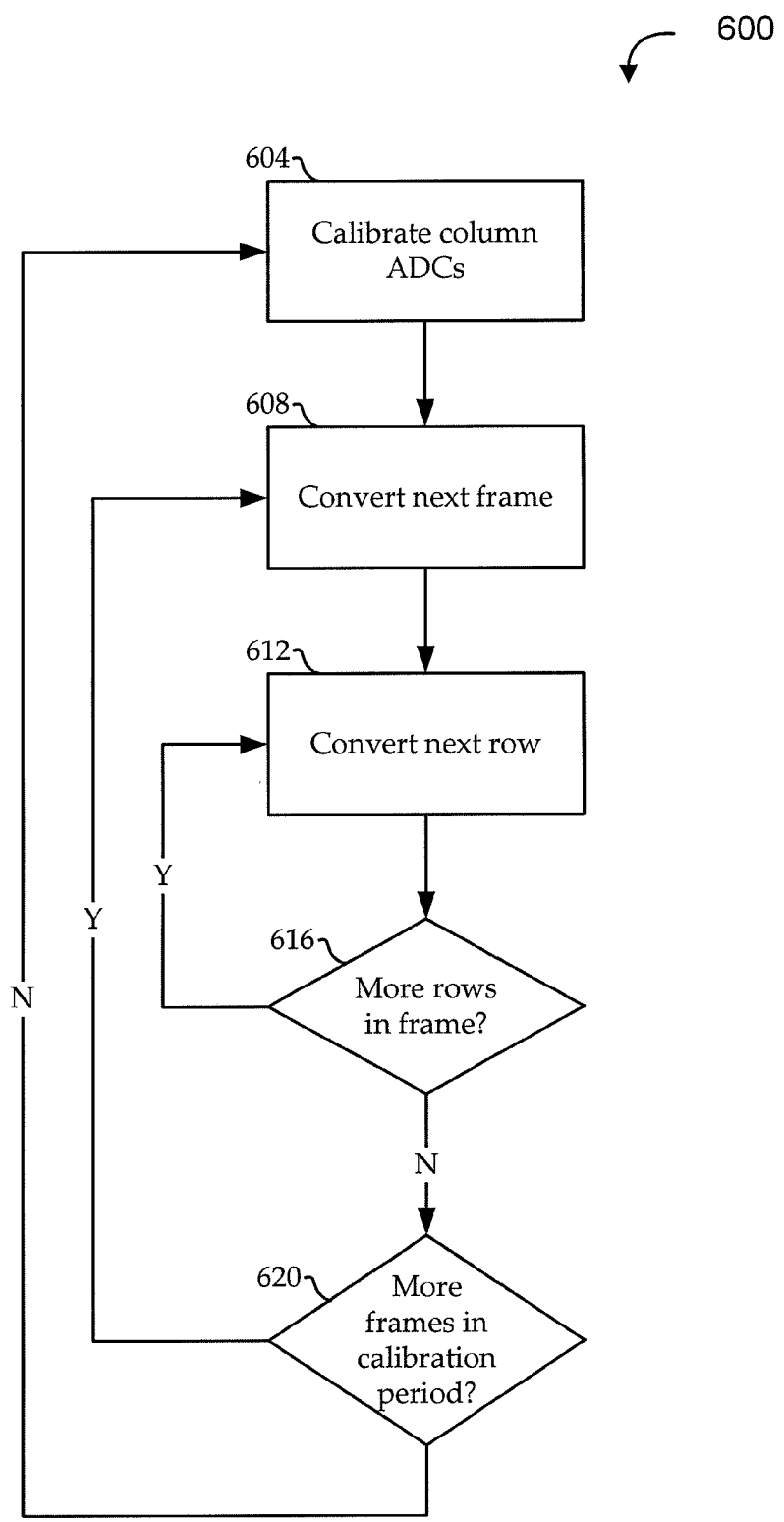
FIG. 6 shows a high level flow diagram of the calibration and conversion flow for an image processing system, according to various embodiments.

It will be appreciated that the system (e.g., system, device, component, etc.) embodiments discussed above, as well as additional embodiments, may be used to implement various method embodiments. FIG. 6 shows a high level flow diagram of the calibration and conversion flow for an image processing system, according to various embodiments. The method 600 begins at block 604 by executing a calibration sequence for the column ADCs of the image processing system. In various embodiments, the calibration is executed as described above with reference to FIGS. 3A-5B and below with reference to FIG. 7.

At block 608, frame conversion begins, for example, at a frame rate. The frame includes all the rows of the image pixel array (e.g., or some subset of rows of the image pixel array). At block 612, each row is converted serially using the column-parallel ADCs according to their respective calibration values. In some embodiments, the row conversions at block 612 are implemented as described above with reference to FIGS. 3A-5B and below with reference to FIGS. 8A and 8B.

At block 616, a determination is made as to whether rows remain to be converted for the frame. Accordingly, the method 600 iterates block 612 until all the rows for the frame are converted. At block 620, a determination is made as to whether frames remain to be converted for the calibration period. In some embodiments, the calibration is performed at block 604 between each frame (e.g., during the vertical blanking interval, by adding a calibration row to the frame processing time, etc.). In other embodiments, the calibration is performed at block 604 only every n frames. For example, the calibration occurs before every fifth frame.

Figure 7:
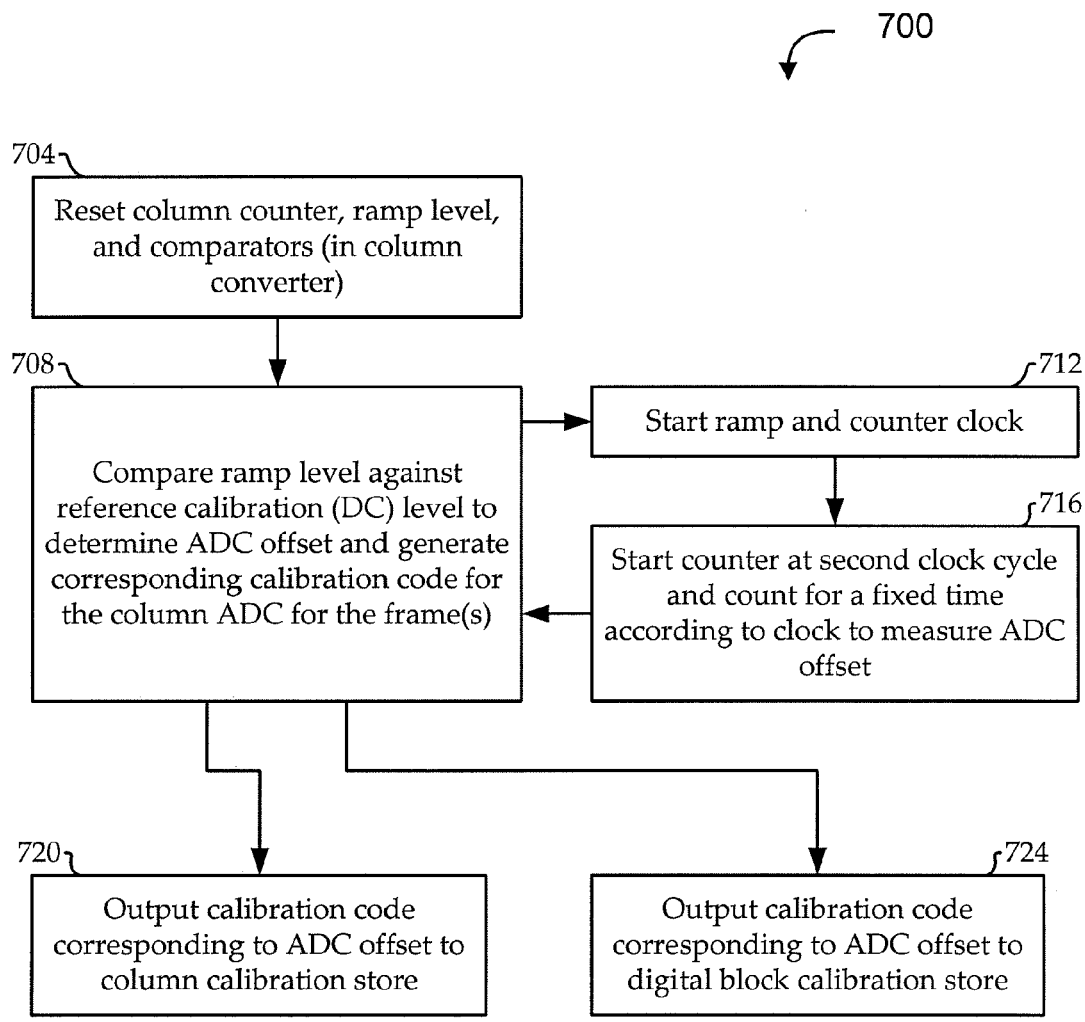
FIG. 7, a flow diagram of a method is shown for frame-wise calibration of a column ADC, according to various embodiments.

Turning to FIG. 7, a flow diagram of a method 700 is shown for frame-wise calibration of a column ADC, according to various embodiments. Some embodiments of the method 700 are implemented using circuits, like those described with reference to FIGS. 3A, 3B, and 4, and/or according to timing illustrated by the calibration row times 510 of FIGS. 5A and 5B. The method 700 begins at block 704 by resetting the column counter, ramp level, and comparators (in the column converter).

At block 708, a ramp level is compared against a reference calibration (DC) level to determine an ADC offset corresponding to the column ADC. Also at block 708, a corresponding calibration code is generated for the column ADC for the frame or frames (e.g., depending on the calibration period). In some embodiments, the determination of the ADC offset and generation of the calibration code are implemented according to block 712 and 716. At block 712, a ramp/counter clock starts, and a ramp signal begins ramping down. At block 716, a column counter is started (e.g., at the second clock cycle when using two's complement techniques), and continues to count for a fixed time according to clock to measure the ADC offset.

As described above with reference to FIGS. 3A-5B, the calibration code may be used in different ways. In some embodiments, at block 720, the calibration code corresponding to the ADC offset is output to a column calibration store at the column ADC. The calibration code may then be used for row conversions according to the method 800a of FIG. 8A described below. In other embodiments, at block 724, the calibration code corresponding to the ADC offset is output to a calibration store at the digital block. The calibration code may then be used for row conversions according to the method 800b of FIG. 8B described below.

Figure 8A:
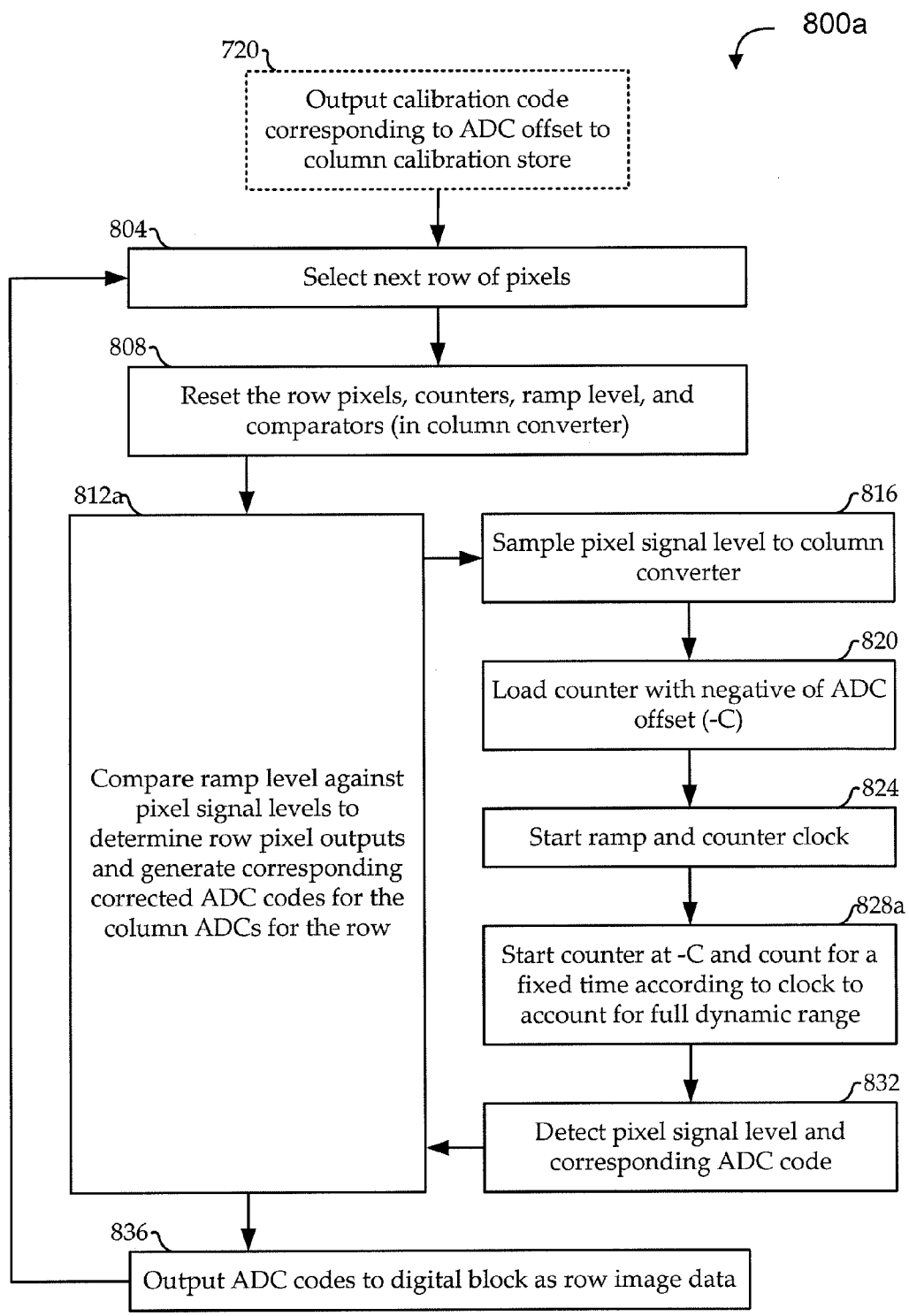
FIGS. 8A and 8B show flow diagrams of methods for converting row image data using calibration, according to various embodiments.

FIG. 8A shows a flow diagram of a method 800a for converting row image data using calibration, according to one set of embodiments. Some embodiments of the method 800a are implemented using circuits, like those described with reference to FIGS. 3B and 4, and/or according to timing illustrated by the optical row time 510 of FIG. 5A. Embodiments of the method 800a occur subsequent to output of calibration codes corresponding to ADC offsets to respective column calibration stores at column ADCs according to block 720 of FIG. 7 (shown as a dashed box for context).

The method 800a begins at block 804 by selecting a next row of pixels. At block 808, the row pixels, counters, ramp level, and comparators (in the column converter) are reset. At block 812a, a ramp level is compared against pixel signal levels to determine row pixel outputs and corresponding corrected ADC codes are generated for the column ADCs for the row. The determination of row pixel outputs and generation of corresponding corrected ADC codes at block 812a can be implemented in various ways. In one embodiment, the functionality at block 812a is implemented according to blocks 816-832.

For example, at block 816, pixel signal levels for the row pixels are sampled at the column converters (e.g., at one differential input of each first stage comparator). At block 820, the column counters are loaded with the negative of the ADC offset stored at the column calibration stores at the respective column ADCs according to block 720 of FIG. 7. For example, calibration is implemented so that, for an offset value of C, the ending counter value is C−1, and a complement of C−1 (i.e., which equals '−C' according to two-s complement arithmetic) is stored at the column calibration stores. Loading the '−C' value to the column counter effectively subtracts the offset while allowing the column counter to exploit its full dynamic range during the optical row time, as described above.

At block 824, a ramp/counter clock starts, and a ramp signal begins ramping down. The column counter may then start, at block 828a, counting from the loaded value (e.g., '−C') and continuing for a fixed time according to the clock to account for the counter's (e.g., or ramp's) full dynamic range. At block 832, the pixel signal level is detected, for example, as a corresponding ADC code according to a counter value. The corrected ADC codes are output to the digital block as row image data at block 836. Notably, the offset has already been applied to the row image data prior to being read out to the digital block.

Figure 8B:
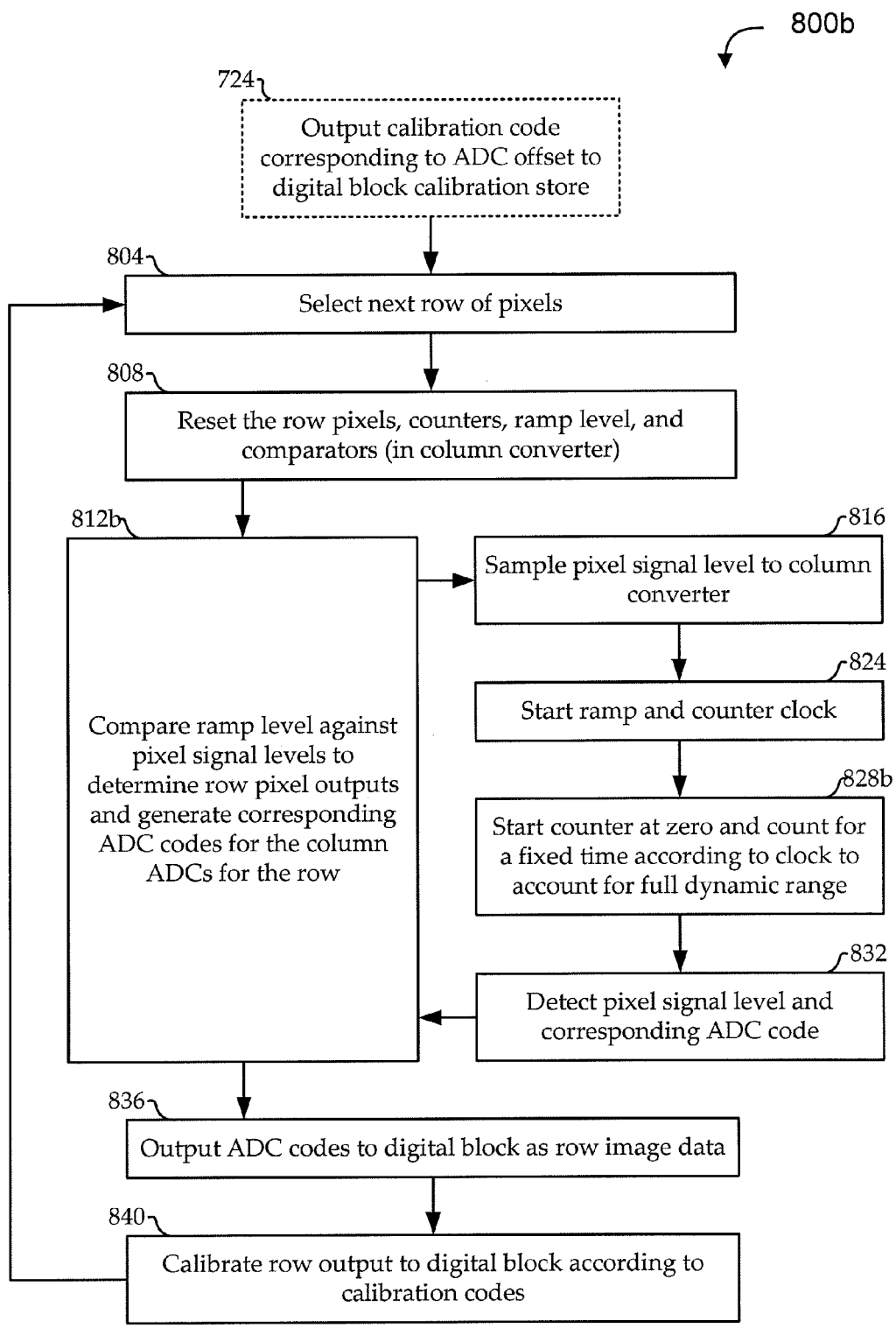

FIG. 8B shows a flow diagram of a method 800b for converting row image data using calibration, according to another set of embodiments. Some embodiments of the method 800b are implemented using circuits, like those described with reference to FIGS. 3A and 4, and/or according to timing illustrated by the optical row time 510 of FIG. 5B. Embodiments of the method 800b occur subsequent to output of calibration codes corresponding to ADC offsets to a calibration store at the digital block according to block 724 of FIG. 7 (shown as a dashed box for context).

Portions of the method 800b are implemented substantially as respective portions of the method 800a of FIG. 8A, and are labeled using the same reference designators. For example, method 800b begins at block 804 by selecting a next row of pixels. At block 808, the row pixels, counters, ramp level, and comparators (in the column converter) are reset.

At block 812b, a ramp level is compared against pixel signal levels to determine row pixel outputs and corresponding ADC codes are generated for the column ADCs for the row. The determination of row pixel outputs and generation of corresponding corrected ADC codes at block 812b can be implemented in various ways. In one embodiment, the functionality at block 812b is implemented according to blocks 816-832.

For example, at block 816, pixel signal levels for the row pixels are sampled at the column converters (e.g., at one differential input of each first stage comparator). At block 824, a ramp/counter clock starts, and a ramp signal begins ramping down. The column counter may then start, at block 828b, counting from '0' and continuing for a fixed time according to the clock to account for the counter's (e.g., or ramp's) full dynamic range. At block 832, the pixel signal level is detected, for example, as a corresponding ADC code according to a counter value. The ADC codes are output to the digital block as row image data at block 836.

Notably, unlike in FIG. 8A, where the calibration values are applied at the column ADCs (by offsetting the counter), the calibration values in the embodiments of FIG. 8B are stored at the digital block. As such, the ADC codes output to the digital block as row image data in block 836 are not corrected for ADC offset. At block 840, the row image data is corrected at the digital block according to the calibration codes received for the frame.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An image processing system comprising:
   an image sensor array comprising a plurality of pixels arranged as rows and columns; and
   a converter subsystem comprising a set of column analog-to-digital converters (ADCs), each column ADC communicatively coupled with a corresponding column of the image sensor array and comprising a column counter, the converter subsystem configured to:
   convert incident light exposed to the pixels of each row into digital pixel data for the row using the set of column ADCs and the respective column counter of each column ADC during a frame conversion time, each row being selected serially for processing, and the pixels of each row being converted substantially in parallel by the set of column ADCs; and
   calibrate the set of column ADCs using the respective column counter of each column ADC during an inter-frame time interval that is outside the frame conversion time to generate calibration data for each of the column ADCs, wherein the column counter is reset prior to calibrating the column ADC and is reset again prior to converting the incident light.

2. The image processing system of claim 1, each column ADC further comprising:
a column converter coupled with the column counter of the column ADC and configured to convert a pixel signal level into a crossover time, the pixel signal level corresponding to a portion of the incident light exposed to the pixel of the corresponding column of the image sensor array and of a currently selected row; and
a column memory, communicatively coupled with the column counter, and configured to store a calibration code corresponding to an offset of the column ADC outputted from the column counter during calibrating the set of column ADCs and store an ADC code representing the digital pixel data corresponding to the crossover time outputted from the column counter during converting the incident light into the digital pixel data.

3. The image processing system of claim 2, further comprising:
a digital block communicatively coupled with the set of column ADCs and comprising:
a calibration data store configured to read out the calibration codes from the column memories of the set of column ADCs; and
an image data store configured to read out the digital pixel data from the column memories of the set of column ADCs,
the digital block configured to correct the digital pixel data at least according to the calibration data and to output the corrected digital pixel data as digital image data.

4. The image processing system of claim 2, each column ADC further comprising:
a column calibration store, communicatively coupled with the column counter and the column memory, and configured to store the calibration code generated by the column counter,
the column counter configured, during converting the incident light into the digital pixel data, to:
load the calibration code from the column calibration store; and
output the digital pixel data as a corrected ADC code corresponding to the crossover time and corrected according to the calibration code.

5. The image processing system of claim 4, further comprising:
a digital block communicatively coupled with the set of column ADCs and configured to read out the digital pixel data and to process the digital pixel data into digital image data.

6. The image processing system of claim 1, the converter subsystem configured to calibrate the set of column ADCs during the inter-frame time interval that is prior to each frame conversion time.

7. The image processing system of claim 1, the set of column ADCs configured to convert the incident light exposed to the pixels of each row into digital pixel data for the row by comparing pixel output signals generated by each of the pixels against a ramp signal.

8. The image processing system of claim 7, each column ADC comprising a gain stage configured to differentially compare the pixel output signals generated by each of the pixels against the ramp signal to mitigate power supply noise while converting the incident light into the digital pixel data.

9. A method comprising:
calibrating a set of column ADCs using a counter for each of the column ADCs during an inter-frame time interval that is outside a frame conversion time to generate a calibration code corresponding to each of the column ADCs;
converting incident light exposed to the pixels of an image sensor array into corresponding digital pixel data using the set of column ADCs and the counter for each of the column ADCs during the frame conversion time, the image sensor array comprising a plurality of pixels arranged as rows and columns, and each column ADC communicatively coupled with a column of the image sensor array, such that each row is selected serially by the set of column ADCs for processing according to a row time of the frame conversion time, and the pixels of each row are converted substantially in parallel by the set of column ADCs during the corresponding row time;
resetting the counter prior to calibrating the column ADC, and resetting the counter again prior to converting the incident light and
correcting the digital pixel data according at least to the calibration codes for the set of column ADCs.

10. The method of claim 9, wherein converting the incident light into the corresponding digital pixel data using the set of column ADCs during the frame conversion time comprises:
converting a pixel signal level for each pixel into a crossover time, each pixel signal level corresponding to a portion of the incident light exposed to its respective pixel; and
outputting the digital pixel data from the column ADCs as ADC codes corresponding to the crossover times.

11. The method of claim 10, wherein:
converting the pixel signal level for each pixel into a crossover time comprises:
starting a ramp signal having a ramp level that changes according to a clock and a slope;
starting the counter that adjusts a counter value according to the clock; and
comparing the pixel signal level for each pixel to the ramp level to determine the respective crossover time as when the pixel signal level and the ramp level cross; and
outputting the digital pixel data as the ADC codes comprises outputting the counter values corresponding to the crossover times for the respective pixels.

12. The method of claim 11, wherein:
comparing the pixel signal level for each pixel to the ramp level comprises comparing the pixel signal level for each pixel to the ramp level differentially so as to mitigate power supply noise.

13. The method of claim 10, further comprising:
storing the calibration codes to a digital block communicatively coupled with the set of column ADCs;
reading out the digital pixel data from the column ADCs to the digital block; and
correcting the digital pixel data at the digital block at least according to the calibration codes.

14. The method of claim 10, further comprising:
storing the calibration codes at the column ADCs; and
correcting the ADC codes at the column ADCs according to the calibration codes,
wherein outputting the digital pixel data from the column ADCs comprises outputting the digital pixel data as the corrected ADC codes corresponding to the crossover times corrected according to the calibration codes.

15. The method of claim 14, wherein:
each column ADC comprises a column calibration store; and
storing the calibration codes at the column ADCs comprises storing the calibration code for each column ADC at its column calibration store.

16. The method of claim 14, wherein:
converting the pixel signal level for each pixel into a crossover time comprises:
starting a ramp signal having a ramp level that changes according to a clock and a slope;
loading the counter that adjusts a counter value according to the clock with a starting counter value that corresponds to a negative of the calibration code;
starting the counter from the starting counter value; and
comparing the pixel signal level for each pixel to the ramp level to determine the respective crossover time as when the pixel signal level and the ramp level cross; and
outputting the digital pixel data as the ADC codes comprises outputting the counter values corresponding to the crossover times for the respective pixels offset according to the adjusted starting counter value.

17. The method of claim 9, wherein:
the frame conversion time occurs iteratively substantially at a frame rate, each instance of the frame conversion time being preceded by an instance of the inter-frame time interval; and
the calibrating step is performed according to a calibration interval, n, such that the calibrating step is performed during each nth instance of the inter-frame time interval.

18. The method of claim 17, wherein:
n is one, such that the calibrating step is performed during each instance of the inter-frame time interval.

19. A system comprising:
means for calibrating a set of column ADCs using a counter for each of the column ADCs during an inter-frame time interval that is outside a frame conversion time to generate a calibration code corresponding to each of the column ADCs;
means for converting incident light exposed to the pixels of an image sensor array into corresponding digital pixel data using the set of column ADCs and the counter for each of the column ADCs during the frame conversion time, the image sensor array comprising a plurality of pixels arranged as rows and columns, and each column ADC communicatively coupled with a column of the image sensor array, such that each row is selected serially by the set of column ADCs for processing according to a row time of the frame conversion time, and the pixels of each row are converted substantially in parallel by the set of column ADCs during the corresponding row time, wherein the counter is reset prior to calibrating the column ADC and is reset again prior to converting the incident light; and
means for correcting the digital pixel data according at least to the calibration codes for the set of column ADCs.

20. The system of claim 19, wherein the means for converting the incident light into the corresponding digital pixel data using the set of column ADCs during the frame conversion time comprises:
means for converting a pixel signal level for each pixel into a crossover time, each pixel signal level corresponding to a portion of the incident light exposed to its respective pixel; and
means for outputting the digital pixel data from the column ADCs as ADC codes corresponding to the crossover times.

21. The system of claim 20, further comprising:
means for storing the calibration codes to a digital block communicatively coupled with the set of column ADCs;
means for reading out the digital pixel data from the column ADCs to the digital block; and
means for correcting the digital pixel data at the digital block at least according to the calibration codes.

22. The system of claim 20, further comprising:
means for storing the calibration codes at the column ADCs; and
means for correcting the ADC codes at the column ADCs according to the calibration codes,
wherein the means for outputting the digital pixel data from the column ADCs comprises means for outputting the digital pixel data as the corrected ADC codes corresponding to the crossover times corrected according to the calibration codes.

23. The image processing system of claim 1, wherein the plurality of pixels includes a first set of pixels of a first color and a second set of pixels of a second color, and wherein a first reference signal from a reference generator is used for conversion of the first set of pixels of the first color, and a second reference signal that is different than the first reference signal is used for conversion of the second set of pixels of the second color.

24. The method of claim 9, wherein a multi-stage comparator is used during the inter-frame time interval to generate the calibration code, and the method further comprises setting the multi-stage comparator in an auto-zero mode prior to generating the calibration code.

* * * * *